(12) United States Patent
Jung et al.

(10) Patent No.: US 11,215,107 B2
(45) Date of Patent: Jan. 4, 2022

(54) HIGH VOLTAGE COOLING FAN MOTOR UNIT

(71) Applicant: Hanon Systems, Daejeon (KR)

(72) Inventors: Min Gyo Jung, Daejeon (KR); Sang Hun Kim, Daejeon (KR); Sung Jun Park, Daejeon (KR); Seong Kook Cho, Daejeon (KR); Jae Kyoung Jin, Daejeon (KR)

(73) Assignee: Hanon Systems, Daejeon (KR)

( * ) Notice: Subject to any disclaimer, the term of this patent is extended or adjusted under 35 U.S.C. 154(b) by 439 days.

(21) Appl. No.: 16/098,292

(22) PCT Filed: Jul. 14, 2017

(86) PCT No.: PCT/KR2017/007604
§ 371 (c)(1),
(2) Date: Nov. 1, 2018

(87) PCT Pub. No.: WO2018/012937
PCT Pub. Date: Jan. 18, 2018

(65) Prior Publication Data
US 2019/0145302 A1 May 16, 2019

(30) Foreign Application Priority Data
Jul. 15, 2016 (KR) .................. 10-2016-0090052

(51) Int. Cl.
*F01P 5/04* (2006.01)
*F04D 25/06* (2006.01)
(Continued)

(52) U.S. Cl.
CPC ............... *F01P 5/04* (2013.01); *F04D 25/06* (2013.01); *H02K 5/18* (2013.01); *H02K 9/02* (2013.01);
(Continued)

(58) Field of Classification Search
CPC .... H02K 5/18; H02K 9/02; H02K 9/04; F01P 5/04; F01P 2005/046; F04D 25/06; Y02T 10/64
See application file for complete search history.

(56) References Cited

U.S. PATENT DOCUMENTS 6,291,912 B1    9/2001   Nadir et al.
7,843,096 B2 *  11/2010  Winkler .................. H02K 11/33
                                                              310/89

(Continued)

FOREIGN PATENT DOCUMENTS

DE           10313273 A1    10/2004
DE        102007009561 A1   11/2007
(Continued)

OTHER PUBLICATIONS

English translation of KR 10 2006 0049906 A, accessed May 25, 2021 from Espacenet.*

*Primary Examiner* — Jeremy A Luks
(74) *Attorney, Agent, or Firm* — Norton Rose Fulbright US LLP; James R. Crawford (57) ABSTRACT

The present disclosure relates to a high voltage cooling fan motor unit. For this purpose, the present disclosure includes a motor 100 located inside a high voltage cooling fan motor housing 102; an inverter PCB 200 located on the upper portion of the motor 100; a cover plate 300 for covering the upper surface of the motor housing 102, assembled in the state of facing the inverter PCB 200, and having a groove part 310 formed on the outside upper surface thereof; a cooling fin 400 provided on the outside of the cover plate 300 in the state of facing the groove part 310; and a power conversion unit 500 mounted on the lower surface of a heat sink 50 in the state of facing the inverter PCB 200 via the heat sink 50 mounted on the inside lower surface of the cover plate 300.

12 Claims, 8 Drawing Sheets

(51) Int. Cl.
*H02K 9/02* (2006.01)
*H02K 5/18* (2006.01)
*H02K 9/04* (2006.01)

(52) U.S. Cl.
CPC .......... *H02K 9/04* (2013.01); *F01P 2005/046* (2013.01); *Y02T 10/64* (2013.01)

(56) References Cited

U.S. PATENT DOCUMENTS

| | | | |
|---|---|---|---|
| 9,991,758 B2* | 6/2018 | DeFilippis | H02K 5/02 |
| 10,033,242 B2* | 7/2018 | Cocks | H02K 11/33 |
| 10,454,350 B2* | 10/2019 | Inokuchi | H02K 13/003 |
| 10,819,171 B2* | 10/2020 | Lee | H02K 7/003 |
| 2008/0144279 A1 | 6/2008 | Yamamoto et al. | |
| 2016/0020678 A1* | 1/2016 | Hirano | H02K 5/22 |
| | | | 310/64 |
| 2016/0087511 A1* | 3/2016 | De Filippis | H02K 11/33 |
| | | | 310/68 D |

FOREIGN PATENT DOCUMENTS

| | | |
|---|---|---|
| DE | 102014225577 A1 | 6/2016 |
| JP | 2015099829 A | 5/2015 |
| KR | 20140095799 A | 8/2014 |
| KR | 20150098884 A | 8/2015 |
| KR | 20160049906 A | 5/2016 |

\* cited by examiner

HIGH VOLTAGE COOLING FAN MOTOR UNIT

This application is a national phase under 35 § 371 of International Application No, PCT/KR2017/007604 filed Jul. 14, 2017, which claims the benefit of priority from Korean Patent Application No. 10-2016-0090052 filed on Jul. 15, 2016, which are hereby incorporated by reference in their entireties.

TECHNICAL FIELD

The present disclosure relates to a high voltage cooling fan motor unit for implementing cooling through quick heat dissipation for a power conversion unit using a groove and a cooling fin that are formed in a cover plate when the power conversion unit provided in a high voltage cooling fan generates heat with high temperature due to the switching thereof.

BACKGROUND ART

In recent years, a hybrid vehicle that uses both fossil fuel and electricity as a driving source, an electric vehicle, or a fuel cell vehicle is in the spotlight according to the low pollution and high fuel efficiency policy due to the problems of depletion of the fossil fuel, environmental pollution, etc., and research for this is being actively performed.

When an engine of the vehicle is cooled by a water cooling type, there is provided a radiator for cooling the cooling water, which is heat-exchanged with high temperature via the engine, by the outside air; the rear of the radiator is provided with a cooling fan for enhancing cooling efficiency by forcibly flowing in the outside air; and a motor for rotating the cooling fan is provided therein.

Generally, an air conditioning device for the vehicle is for cooling or heating a vehicle interior by introducing air outside the vehicle into the vehicle interior, or by heating or cooling it in the process of circulating the air in the vehicle interior, and includes an evaporator for cooling operation, a heater for heating operation, and an air blower for blowing the air cooled or heated by the evaporator and the heater, and the air blower is provided with a motor.

Explaining the motor that is a driving means of the cooling fan, for example, the motor for driving the cooling fan is usually installed adjacent to the engine, such that it is heated by the heat of the engine and thereby can cause damage or malfunction.

In addition, even if it is not heated by receiving heat from the outside, it is heated by the heat generated in the motor itself when being driven for a long time. As a means for preventing this, there is known a technique for installing a heat shield plate, that is, a heat shield on the engine side of a cooling fan motor, thus preventing the heat generated in the engine from being conducted to the cooling fan motor.

Particularly, a high voltage cooling fan motor operated with a high voltage uses an IPM in order to convert DC power into three-phase AC power through switching in an inverter. The IPM is composed of a gate driver and an IGBT, the high voltage cooling fan motor is heated with high temperature due to the switching of the IPM upon driving, and the high temperature heat thus generated is heat-dissipated through a heat sink attached to the IPM and a cover plate molded with a magnesium alloy in the high voltage cooling fan motor.

A conventional high voltage cooling fan motor unit will be described with reference to the drawings.

Figure 1:
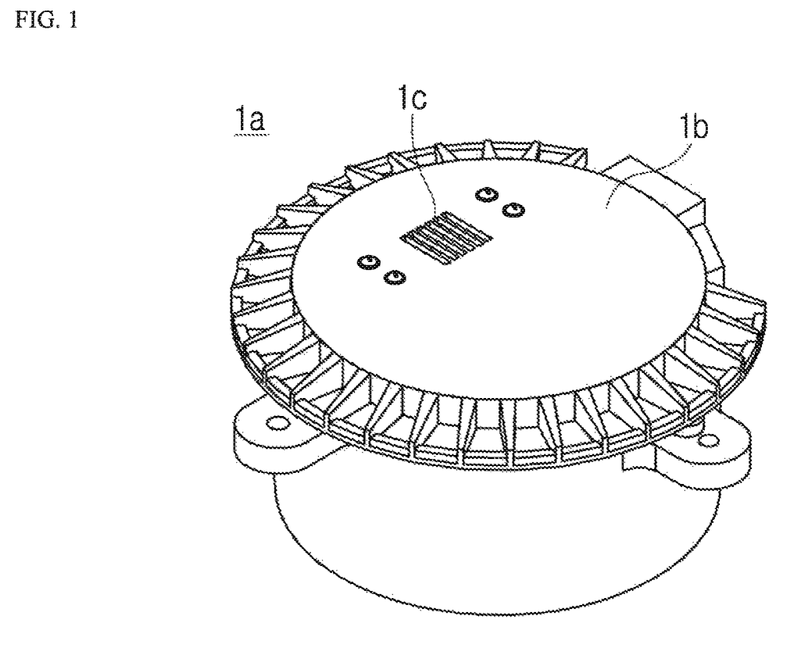
FIG. 1 is a perspective diagram illustrating a conventional high voltage cooling fan motor unit.

Referring to FIG. 1, a conventional high voltage cooling fan motor unit 1a has a cover plate 1b provided on the upper surface thereof, and a cooling fin 1c is formed on the cover plate 1b.

The cooling fin 1c has increased the temperature of the inverter and the high voltage cooling fan motor because the number of the cooling fin for heat dissipation was small and a sufficient heat dissipation area was not ensured.

Accordingly, malfunction of the high voltage cooling fan motor or malfunction of the inverter element can be caused, such that the measure for this is needed.

DISCLOSURE

Technical Problem

The present disclosure is intended to solve the above problem, and an object of the present disclosure is to provide a high voltage cooling fan motor unit for guiding the moving flow of cooling air for stable heat dissipation of the power conversion unit mounted on the high voltage cooling fan motor, thus enhancing heat dissipation performance.

Technical Solution

The present disclosure for achieving the object includes a motor located inside a high voltage cooling fan motor housing; an inverter PCB located on the upper portion of the motor; a cover plate for covering the upper surface of the motor housing, assembled in the state of facing the inverter PCB, and having a groove part formed on the outside upper surface thereof; a cooling fin provided on the outside of the cover plate in the state of facing the groove part; and a power conversion unit mounted on the lower surface of a heat sink in the state of facing the inverter PCB via the heat sink mounted on the inside lower surface of the cover plate.

The groove part includes an inclined part inclined from the outside surface of the cover plate toward the inside lower surface thereof; and an extension part horizontally extended from the lower end of the inclined part toward the cooling fin.

The groove part is configured so that both sidewall surfaces facing each other in the width direction thereof are rounded toward the cooling fin in order to guide the movement of cooling air to the cooling fin.

The groove forming direction of the groove part and the extension direction of the cooling fin coincide with each other.

The cooling fin is extended longer than the longitudinal length of the power conversion unit.

The cooling fin includes a fin inclined part having the cross-sectional area of the front surface facing the groove part reduced toward the groove part.

The cooling fin is formed in any one shape of an I-shape, a T-shape, or an X-shape in the cross-sectional shape.

The cooling fin is extended in one direction toward the longitudinal end portion of the groove part.

The cooling fin is located on the same plane as the groove part.

The cooling fin has an interval spaced apart from each other narrowed toward the longitudinal end portion of the groove part.

A high voltage cooling fan motor unit in accordance with another embodiment of the present disclosure includes a motor located inside a high voltage cooling fan motor housing; an inverter PCB located on the upper portion of the motor; a cover plate for covering the upper surface of the motor housing, assembled in the state of facing the inverter PCB, and having a groove part, which is formed on the outside upper surface thereof, and a plurality of opening holes, which are opened in the circumferential direction thereof, formed thereon; a cooling fin provided on the outside of the cover plate in the state of facing the groove part; and a power conversion unit mounted on the lower surface of a heat sink in the state of facing the inverter PCB via the heat sink mounted on the inside lower surface of the cover plate.

The cooling fin is protruded to be inclined upwards toward the outside of the cover plate toward the longitudinal end portion thereof.

The opening hole is opened to be inclined from the upper surface of the cover plate toward the outer circumferential surface of the motor housing.

The cooling fin includes a main cooling fin located in the state of facing the groove part; and an auxiliary cooling fin spaced toward the outside of the radial direction of the cover plate with respect to the main cooling fin.

Advantageous Effects

The high voltage cooling fan motor unit in accordance with an embodiment of the present disclosure can perform stable heat dissipation of the power conversion unit using the groove part and cooling fin of the cover plate even when the heat is generated with high temperature while the power conversion unit is operated, thus reducing occurrence of malfunction or failure of the high voltage cooling fan motor unit to stably use it.

Embodiments of the present disclosure can form the groove on the upper surface of the cover plate to change the structure so that the cooling air can move to the cooling fin, thus implementing the heat dissipation of the high voltage cooling fan motor unit.

Embodiments of the present disclosure can induce the cooling air to the motor housing in which the motor is received, thus implementing stable heat dissipation.

BEST MODE

Figure 2:
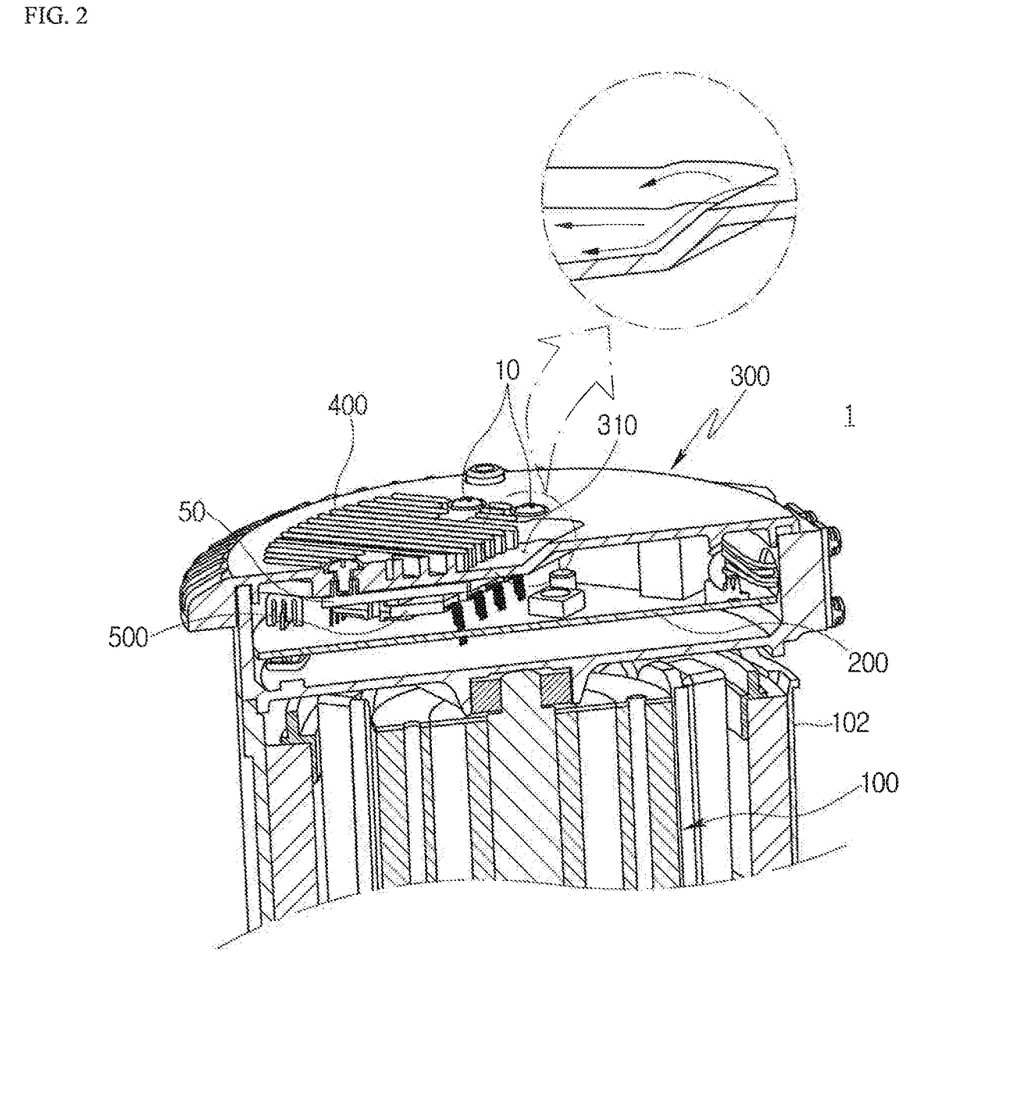
FIG. 2 is a longitudinal cross-sectional perspective diagram of a high voltage cooling fan motor unit in accordance with an embodiment of the present disclosure.

Preferred embodiments in accordance with the present disclosure will be described in detail with reference to the accompanying drawings. FIG. 2 is a longitudinal cross-sectional perspective diagram of a high voltage cooling fan motor unit in accordance with an embodiment of the present disclosure, FIG. 3 is a longitudinal cross-sectional diagram of the high voltage cooling fan motor unit in accordance with an embodiment of the present disclosure, and FIG. 4 is an exploded perspective diagram illustrating a cooling fin of the high voltage cooling fan motor unit in accordance with an embodiment of the present disclosure.

Figure 3:
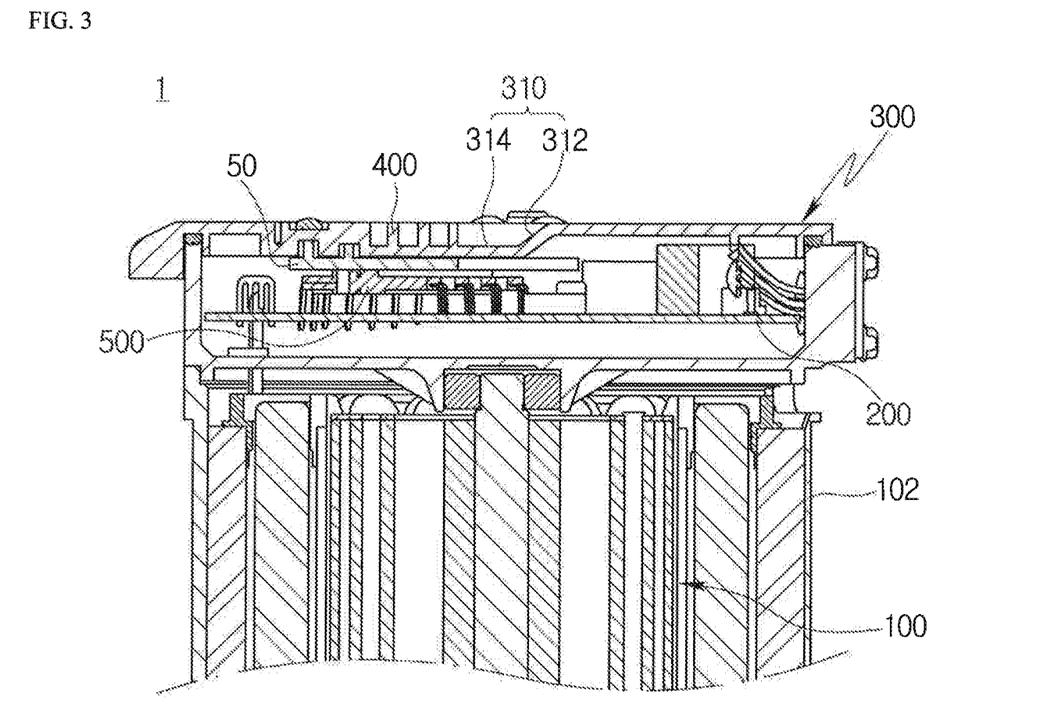
FIG. 3 is a longitudinal cross-sectional diagram of the high voltage cooling fan motor unit in accordance with an embodiment of the present disclosure.
Figure 4:
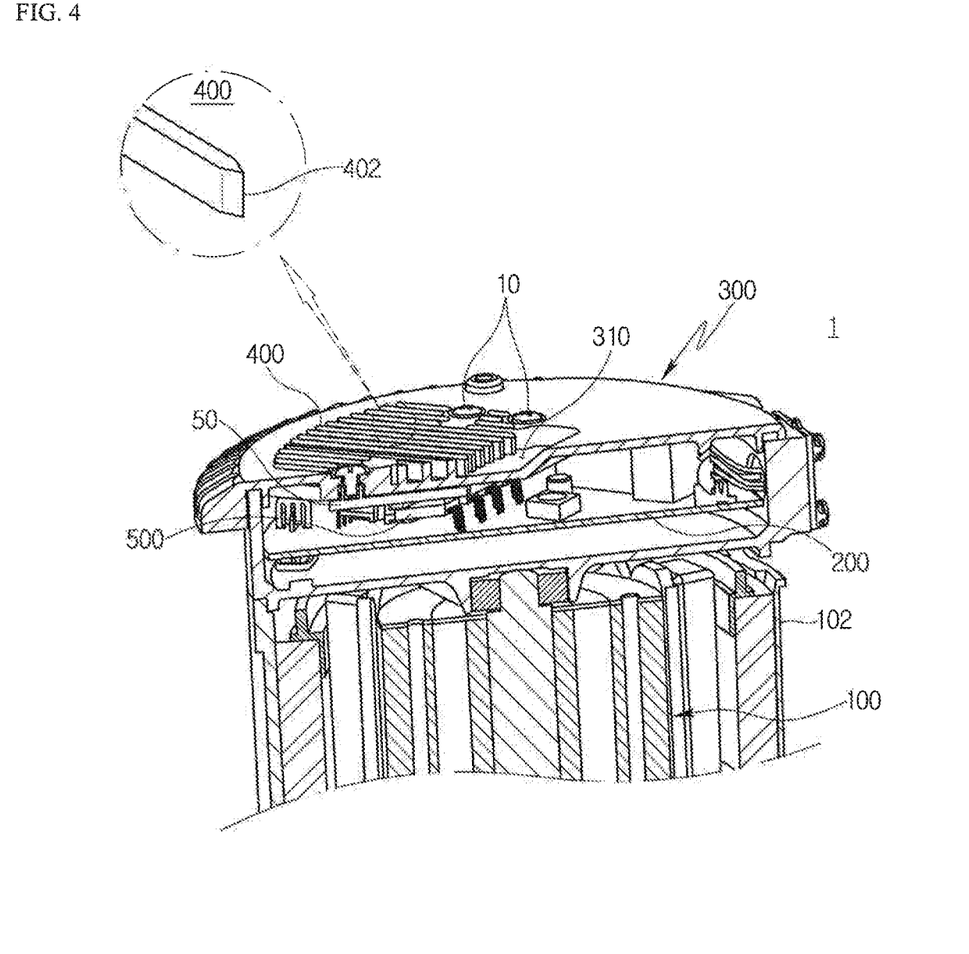
FIG. 4 is an exploded perspective diagram illustrating a cooling fin of the high voltage cooling fan motor unit in accordance with an embodiment of the present disclosure.

Referring to FIGS. 2 to 4, a high voltage cooling fan motor unit 1 in accordance with an embodiment of the present disclosure can be mounted on a fuel cell vehicle, for example, and includes a motor 100 located inside a high voltage cooling fan motor housing 102, an inverter PCB 200 located on the upper portion of the motor 100, a cover plate 300 for covering the upper surface of the motor housing 102, assembled in the state of facing the inverter PCB 200, and having a groove part 310 formed on the outside upper surface thereof, a cooling fin 400 provided on the outside of the cover plate 300 in the state of facing the groove part 310, and a power conversion unit 500 mounted on the lower surface of a heat sink 50 in the state of facing the inverter PCB 200 via the heat sink 50 mounted on the inside lower surface of the cover plate 300.

In the high voltage cooling fan motor unit 1 in accordance with the present embodiment, the motor housing 102 is mounted on a shroud (not illustrated), and a pair of fans (not illustrated) located on the front of the shroud (not illustrated) are rotated by receiving the rotating force of a rotating shaft (not illustrated) extended from the motor 100. For the reference, a radiator unit is not illustrated.

The motor housing 102 has the inverter PCB 200 located on the upper portion of the motor 100 therein based on the drawing, and a plurality of electric elements are mounted on the inverter PCB 200, thus performing stable operation of the motor 100.

The cover plate 300, as a cover for covering the upper surface of the high voltage cooling fan motor unit 1, has the groove part 310 provided on the outside upper surface thereof, thus implementing inflow of the cooling air.

The cover plate 300 is maintained in the state in which the heat sink 50 is closely attached to the inside lower surface thereof via a fixing member 10. The fixing member 10 can be a screw, for example, but can be also changed to other configurations.

The heat sink 50 delivers high temperature heat generated in the power conversion unit 500, which will be described later, to the cooling fin 400, thus implementing stable heat dissipation due to the high temperature heat-generation of the power conversion unit 500 operated with high temperature.

The power conversion unit 500 uses an IPM, which is composed of a gate driver and an IGBT, in order to convert DC power into three-phase AC power through switching in the inverter PCB 200, and has the feature that is operated by generating heat with high temperature due to the switching of the IPM.

The power conversion unit 500 dissipates the high temperature heat to the outside of the cover plate 300 through heat transfer with the heat sink 50 closely attached thereto, thus preventing malfunction due to overheating.

In the present embodiment, a plurality of cooling fins 400 are provided on the cover plate 300 together with the heat sink 50, thus further dissipating heat through the cooling air.

In order to dissipate heat more efficiently, the cooling air is guided to the cooling fin 400 and thereby, the cooling fin 400 can quickly dissipate the high temperature heat generated in the power conversion unit 500.

The cover plate 300 has the groove part 310 formed on the location illustrated in the drawing, and the power conversion unit 500 is located on the inside lower surface of the cover plate 300 that is the location facing the cooling fin 400.

The groove part 310 is extended to have a longer horizontal directional length than a vertical directional length, and includes an inclined part 312 inclined from the outside surface of the cover plate 300 toward the inside lower surface thereof, and an extension part 314 horizontally extended from the lower end of the inclined part 312 toward the cooling fin 400. For the reference, the horizontal directional length of the groove part 310 can be extended to the length similar to the length corresponding to the entire width length where the cooling fin 400 is located, or can be extended to a slightly shorter length.

The groove part 310 in accordance with the present embodiment guides the cooling air to the cooling fin 400 in order to implement stable heat dissipation of the power conversion unit 500 through cooling of the plurality of cooling fins 400 rather than simply the groove formed on the cover plate 300 at a predetermined depth.

Herein, the guide means that guides the moving direction of the cooling air to the cooling fin 400 to supply low temperature air necessary for heat dissipation to the plurality of cooling fins 400.

The inclined part 312 is extended toward the extension part 314 to be inclined at a predetermined angle in order to guide the cooling air to the inner region constituting the groove part 310. The extension part 314 is formed in a planar section and is formed to guide the cooling air guided through the inclined part 312 to the cooling fin 400.

The groove part 310 is extended so that both sidewall surfaces facing each other in the width direction thereof are rounded toward the cooling pin 400 in order to guide the movement of the cooling air to the cooling fin 400.

When configured with such a structure, the moving flow of the cooling air is classified into a first moving flow that descends from the upper surface of the groove part 310 toward the extension part 314, and a second moving flow that moves along the rounded structure of both sidewall surfaces of the groove part 310 as illustrated by arrows in the enlarged diagram.

The above-described first moving flow means the moving flow of the cooling air supplied from the center of the cooling fin 400 and the width direction of the groove part 310 adjacent to the center. Then, the second moving flow means the moving flow of the cooling air for supplying the cooling air to the cooling fin located at the edge of the plurality of cooling fins 400.

As described above, when the moving flow of the cooling air moving through the inner region of the groove part 310 is supplied toward the plurality of cooling fins 400 in the optimized moving pattern, it is possible to reduce the loss due to the vortex, and to increase the flow rate of the cooling air contacting with the cooling fin 400, thus performing more stable heat dissipation of the power conversion unit 500.

The present embodiment is configured so that the groove forming direction of the groove part 310 and the extension direction of the cooling fin 400 coincide with each other together with the guide according to the above-described movement of the cooling air.

In this case, when a large amount of cooling air is flowed into the groove part 310, it can be moved along the outer circumferential surface of the plurality of cooling fins 400, such that it is possible to minimize occurrence of vortex due to unnecessary redirection of the cooling air, thus implementing stable heat dissipation of the power conversion unit 500.

The cooling fin 400 in accordance with the present embodiment is extended longer than the longitudinal length of the power conversion unit 500, such that it is possible to perform heat exchange in the entire region of the power conversion unit 500 where heat is generated with high temperature upon operation, thus stably performing heat dissipation.

When the cooling fin 400 is elongated in length, it is possible to implement the contact with the cooling air maximally utilizing the limited area of the cover plate 300, thus increasing the heat dissipation area of the power conversion unit 500.

Accordingly, when the power conversion unit 500 needs quick heat dissipation during operation with high temperature, it is possible to achieve it through the cooling fin 400, thus performing the cooling of the power conversion unit 500 with the limited heat dissipation area more efficiently.

Referring to FIG. 4, the cooling fin 400 in accordance with the present embodiment is formed with a fin inclined part 402 having the cross-sectional area of the front surface facing the groove part 310 reduced toward the groove part 310. The fin inclined part 402 is formed to minimize the flow resistance due to the peeling of the cooling air at the front end portion of the cooling fin 400 with which the cooling air flowed into the groove part 310 first contacts.

The fin inclined part 402 is extended toward the front to be streamlined-rounded symmetrically when seen from the front thereof, such that the cooling air is moved in the longitudinal direction along the outer circumferential surface of the rounded fin inclined part 402.

The above-described fin inclined part 402 can be changed in other shapes other than the round shape illustrated in the drawing and is not inevitably limited to the shape illustrated in the drawing.

Figure 5:
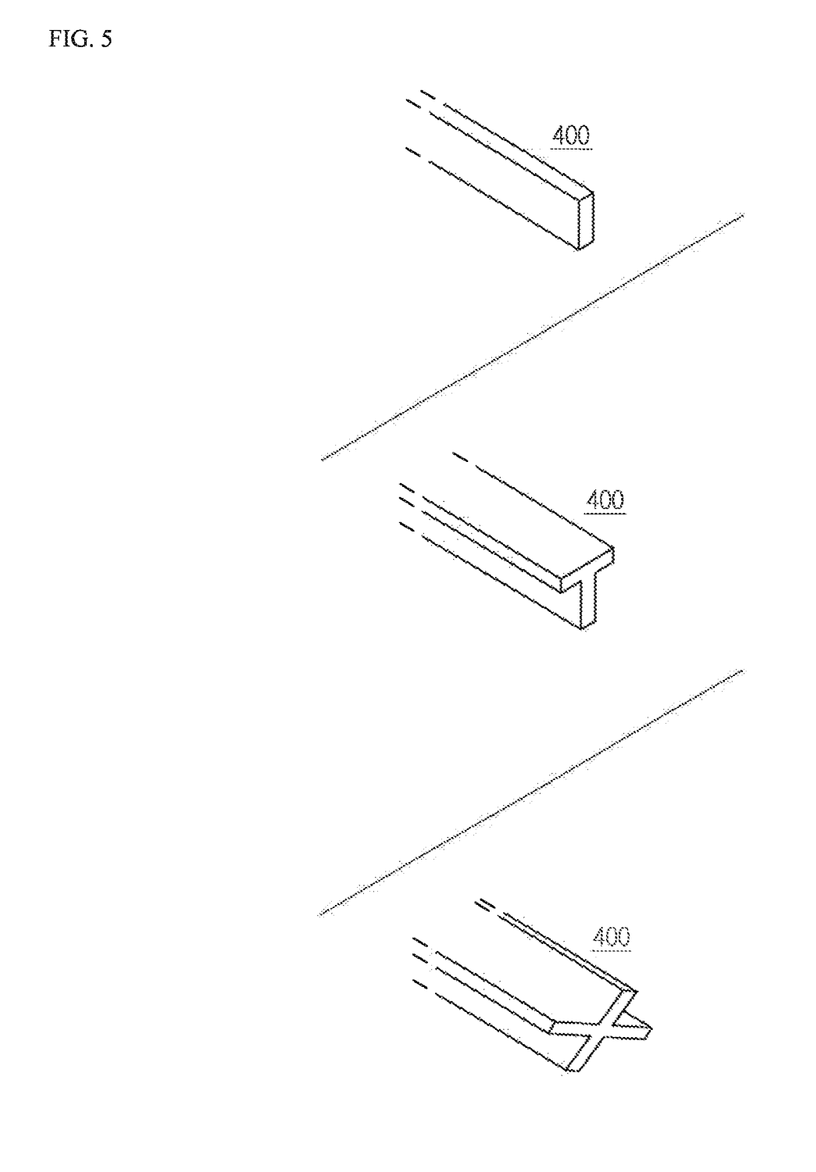
FIG. 5 is a perspective diagram illustrating various embodiments of the cooling fin in accordance with an embodiment of the present disclosure.

Referring to FIG. 5, the cooling fin 400 in accordance with the present embodiment is formed in any one shape of an I-shape, a T-shape, or an X-shape in the cross-sectional shape. As the cross-sectional area of the cooling fin 400 increases, the contact area with the cooling air increases proportionally, such that it is advantageous to maximally increase the cross-sectional area of the cooling fin 400, but the cooling fin 400 can be composed of any one of the above-described cross-sectional shapes for stable flow of cooling air and ease of production.

The cooling fin 400 is extended in one direction from the groove part 310 toward the longitudinal end portion thereof, such that when the cooling air is flowed into the groove part 310, it stably moves along the longitudinal direction in contact with the cooling fin 400. In this case, the high temperature heat generated in the power conversion unit 500, which generates heat with high temperature, can be quickly dissipated to the outside of the cover plate 300 through the cooling fin 400, thus preventing overheating of the inverter PCB 200 or the motor 100.

Accordingly, it is possible to prevent malfunction and failure due to a climatic condition in which the high-temperature external air temperature is maintained, or the high temperature heat generated when the motor 100 is operated for a long time in advance.

The cooling fin 400 in accordance with the present embodiment is located on the same plane as the groove part 310, such that when the cooling air is flowed into the groove part 310 and then is moved to the cooling fin 400, it is not moved to the upside of the cover plate 300 and can be stably moved along the spaced space of the plurality of cooling fins 400.

Figure 6:
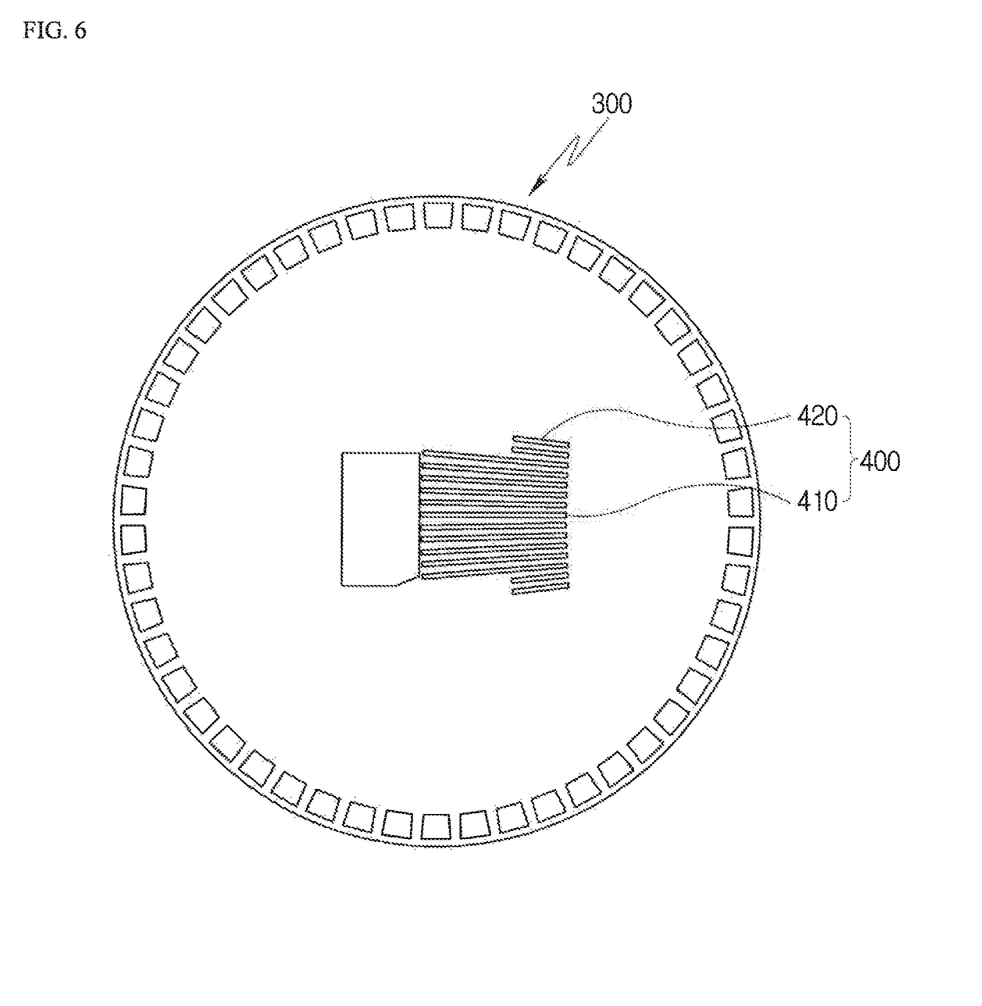
FIG. 6 is a plane diagram illustrating another location state of the cooling fin in accordance with an embodiment of the present disclosure.

Referring to FIG. 6, the cooling fin 400 in accordance with the present embodiment can be configured so that an interval spaced apart from each other is narrowed from the groove part 310 toward the longitudinal end portion thereof.

In this case, the moving speed of the cooling air passing through between the plurality of the cooling fins 400 increases as it moves to the rear end portion thereof, such that the cooling air discharges the cooling air heat-exchanged with high temperature to the outside of the cover plate 300 through the heat dissipation through the heat exchange and the quick movement while moving from the front end portion of the cooling fin 400 toward the rear end portion thereof, thus stably dissipating the heat generated in the power conversion unit 500.

The cooling fin 400 in accordance with the present embodiment includes a main cooling fin 410 located in the state of facing the groove part 310, and an auxiliary cooling fin 420 spaced toward the outside of the radial direction of the cover plate 300 with respect to the main cooling fin 410.

The main cooling fin 410 is located on the upper surface of the cover plate 300 facing the power conversion unit 500 in the state that a plurality of main cooling fins 410 are spaced apart from each other.

The power conversion unit 500 generates heat with high temperature upon operation, such that it is possible to locate it on the upper surface of the cover plate 300 corresponding to the power conversion unit 500 for quick heat dissipation, thus implementing stable heat dissipation together with the heat sink 50.

Accordingly, even if the power conversion unit 500 is maintained in the high temperature state, it is possible to prevent malfunction or failure due to overheating in advance.

The auxiliary cooling fin 420 is spaced outwardly apart from the main cooling fin 410, is extended to a length shorter than the length of the main cooling fin 410 due to the fixing member 10 for fixing the heat sink 50, and is extended in the state illustrated in the drawing due to a mounting hole to which the fixing member 10 is coupled.

A high voltage cooling fan motor unit in accordance with another embodiment of the present disclosure will be described with reference to the drawings.

Figure 7:
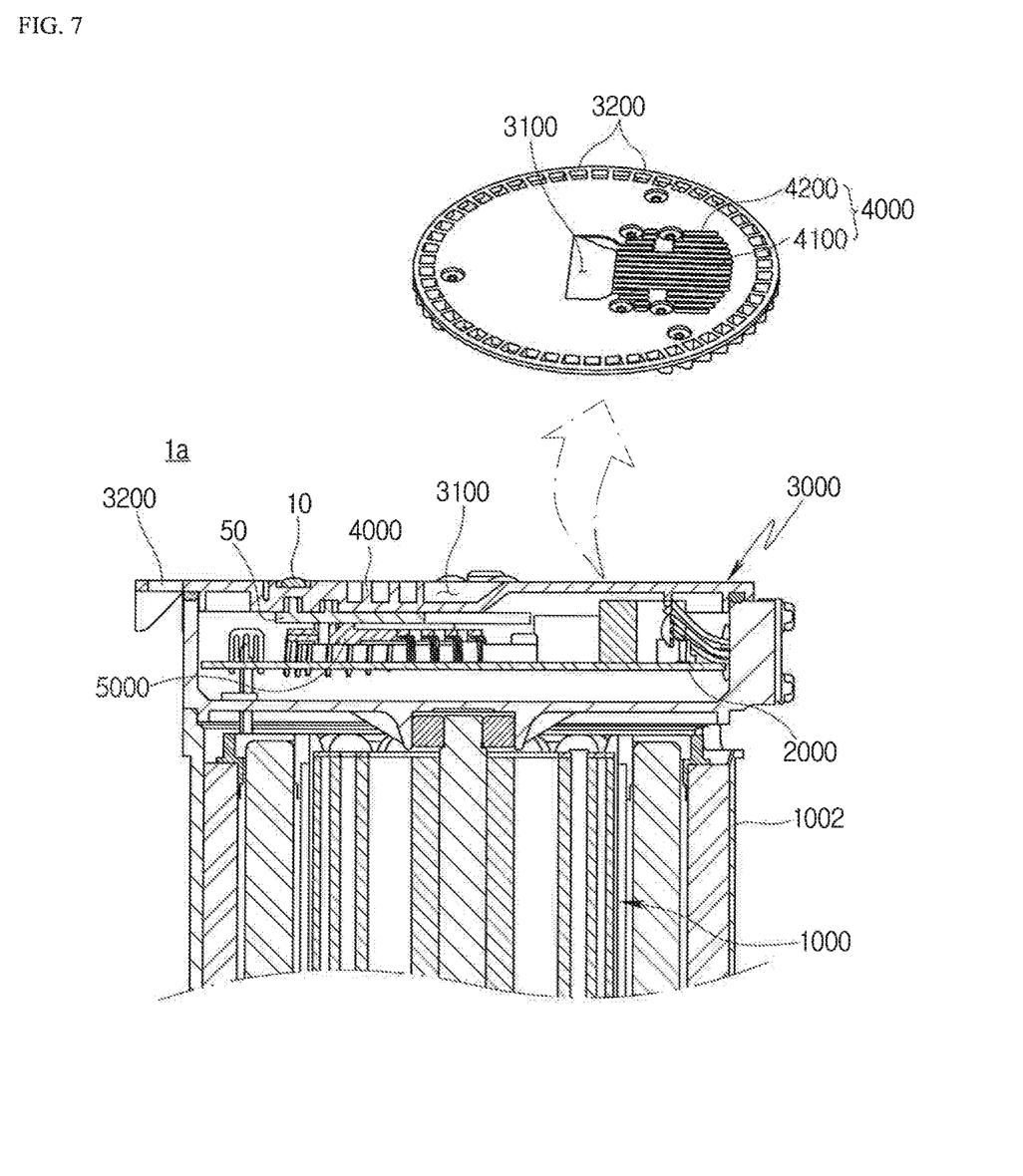
FIG. 7 is a perspective diagram illustrating a high voltage cooling fan motor unit in accordance with another embodiment of the present disclosure.

Referring to FIG. 7, a high voltage cooling fan motor unit 1a in accordance with another embodiment of the present disclosure includes a motor 1000 located inside a high voltage cooling fan motor housing 1002; an inverter PCB 2000 located on the upper portion of the motor 1000; a cover plate 3000 for covering the upper surface of the motor housing 1002, assembled in the state of facing the inverter PCB 2000, and having a groove part 3100, which is formed on the outside upper surface thereof, and a plurality of opening holes 3200, which are opened in the circumferential direction thereof, formed thereon; a cooling fin 4000 provided on the outside of the cover plate 3000 in the state of facing the groove part 3100; and a power conversion unit 5000 mounted on the lower surface of a heat sink 50 in the state of facing the inverter PCB 2000 via the heat sink 50 mounted on the inside lower surface of the cover plate 3000.

The present embodiment is similar to the above-described embodiment in the main structure, but cooling for the motor housing 1002 surrounding the motor 1000 and cooling for the power conversion unit 5000 are performed at the same time, such that there is a difference in that it is possible to implement stable heat dissipation for the high voltage cooling fan motor unit 1a.

The plurality of opening holes 3200 are opened in the circumferential direction of the cover plate 3000 and the cooling air is moved to the motor housing 1002 via the opening hole 3200. The motor housing 1002 is a component for forming the outer shape of the motor 1000 rotating at a high speed, such that when the motor 1000 is operated for a long time, it is possible to supply cooling air thereto to perform cooling, thus preventing overheating.

For example, when the opening hole 3200 is vertically penetrated with respect to the cross-sectional surface of the cover plate 3000, the cooling air passing through the opening hole 3200 is not entirely moved toward the outer circumferential surface of the motor housing 1002 and can be partially moved thereto.

In order to prevent this, in the present embodiment, for this purpose, the opening hole 3200 in accordance with the present embodiment can be opened to be inclined toward the outer circumferential surface of the motor housing 1002 from the upper surface of the cover plate 3000, for example.

As described above, when the opening hole 3200 is formed to be inclined, the moving flow of the cooling air mainly moves toward the outer circumferential surface of the motor housing 1002. Then, when the cooling air passes through the inclined opening hole 3200, the moving flow of the cooling air is guided in the spiral shape toward the end portion of the outer circumferential surface along the longitudinal direction of the motor housing 1002.

When continuously contacting with the outer circumferential surface of the motor housing 1002, the cooling air can stably dissipate the heat generated by the operation of the motor 1000. Particularly, when the cooling air moves in the spiral shape along the outer circumferential surface thereof rather than moving in the longitudinal direction of the motor housing 1002, it is possible to increase the contact time to stably dissipate the heat generated by the operation of the motor 1000, thus preventing failure or malfunction in advance.

Figure 8:
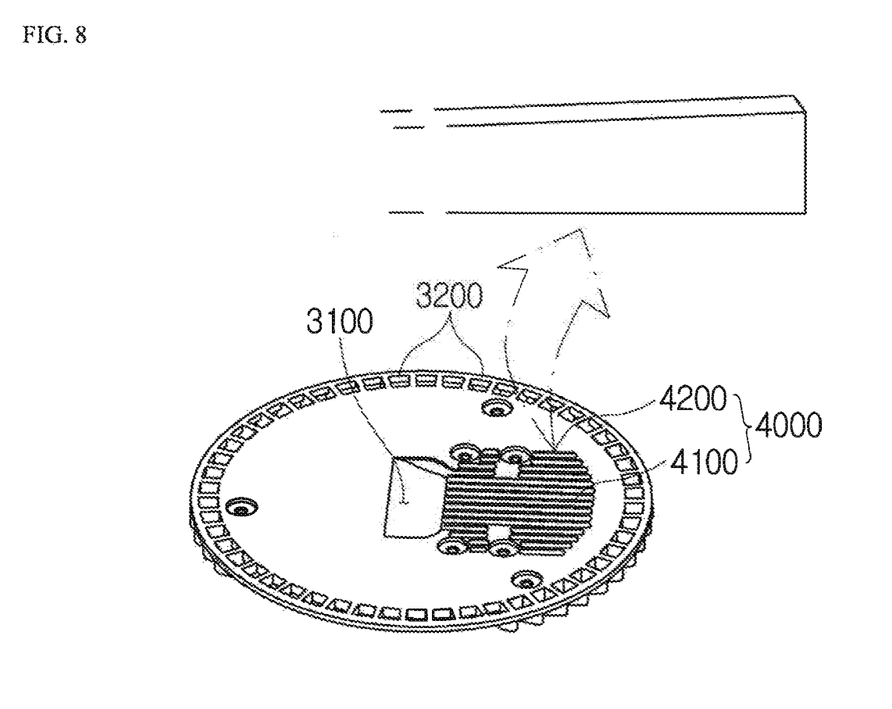
FIG. 8 is a perspective diagram illustrating various embodiments of the cooling fin in accordance with an embodiment of the present disclosure.

Referring to FIGS. 7 and 8, the cooling fin 4000 in accordance with the present embodiment is protruded to be inclined upwards toward the outside of the cover plate 3000 toward the longitudinal end portion thereof. Herein, the protruded height can be protruded within 10 mm and the contact area with the cooling air is increased due to an increase in the heat dissipation area, such that it is possible to maximally suppress the heat generation of the power conversion unit 5000 operated with high temperature.

The cooling fin 4000 in accordance with the present embodiment includes a main cooling fin 4100 located in the state of facing the groove part 3100, and an auxiliary cooling fin 4200 spaced toward the outside of the radial direction of the cover plate 3000 with respect to the main cooling fin 4100.

The main cooling fin 4100 is located on the upper surface of the cover plate 3000 facing the power conversion unit 5000 in the state that a plurality of main cooling fins 4100 are spaced apart from each other.

The power conversion unit 5000 generates heat with high temperature upon operation, such that it is possible to locate it on the upper surface of the cover plate 3000 corresponding to the power conversion unit 5000 for quick heat dissipation, thus implementing stable heat dissipation together with the heat sink 50.

Accordingly, even if the power conversion unit 5000 is maintained in the high temperature state, it is possible to prevent malfunction or failure due to overheating in advance.

The auxiliary cooling fin 4200 is spaced outwardly apart from the main cooling fin 4100, is extended to a length shorter than the length of the main cooling fin 4100 due to the fixing member 10 for fixing the heat sink 50, and is extended to the state illustrated in the drawing due to a mounting hole to which the fixing member 10 is coupled.

INDUSTRIAL APPLICABILITY

The present embodiments provide a motor unit provided with the high voltage cooling fan through various configurations of the cooling fin.

The invention claimed is:

1. A high voltage cooling fan motor unit, comprising:
   a motor located inside a high voltage cooling fan motor housing;
   an inverter PCB located on the upper portion of the motor;
   a cover plate for covering the upper surface of the motor housing, assembled in the state of facing the inverter PCB, and having a groove part formed on the outside upper surface thereof;
   a cooling fin provided on the outside of the cover plate in the state of facing the groove part; and
   a power conversion unit mounted on a lower surface of a heat sink,
   wherein the groove part is configured so that both sidewall surfaces facing each other in the width direction thereof are rounded toward the cooling fin in order to guide the movement of cooling air to the cooling fin, and
   wherein a moving flow of the cooling air is classified into a first moving flow that descends from the upper surface of the groove part toward the extension part, and a second moving flow that moves along the rounded structure of both sidewall surfaces of the groove part.

2. The high voltage cooling fan motor unit of claim 1, wherein the groove part comprises:
   an inclined part inclined from the outside surface of the cover plate toward the inside lower surface thereof; and
   an extension part horizontally extended from the lower end of the inclined part toward the cooling fin.

3. The high voltage cooling fan motor unit of claim 1, wherein the groove forming direction of the groove part and the extension direction of the cooling fin coincide with each other.

4. The high voltage cooling fan motor unit of claim 1, wherein the cooling fin is extended longer than a longitudinal length of the power conversion unit.

5. The high voltage cooling fan motor unit of claim 1, wherein the cooling fin comprises a fin inclined part having the cross-sectional area of the front surface facing the groove part reduced toward the groove part.

6. The high voltage cooling fan motor unit of claim 1, wherein the cooling fin is formed in any one shape of an I-shape, a T-shape, or an X-shape in the cross-sectional shape.

7. The high voltage cooling fan motor unit of claim 1, wherein the cooling fin is extended in one direction from the groove part toward a longitudinal end portion thereof.

8. The high voltage cooling fan motor unit of claim 1, wherein the cooling fin is located on the same plane as the groove part.

9. The high voltage cooling fan motor unit of claim 1, wherein the cooling fin has an interval spaced apart from another cooling fin that narrows from the groove part toward a longitudinal end portion thereof.

10. A high voltage cooling fan motor unit, comprising:
    a motor located inside a high voltage cooling fan motor housing;
    an inverter PCB located on the upper portion of the motor;
    a cover plate for covering the upper surface of the motor housing, assembled in the state of facing the inverter PCB, and having a groove part, which is formed on the outside upper surface thereof, and a plurality of opening holes, which are opened in the circumferential direction thereof, formed thereon;
    a cooling fin provided on the outside of the cover plate in the state of facing the groove part; and
    a power conversion unit mounted on a lower surface of a heat sink,
    wherein the plurality of opening holes are opened to be inclined from the upper surface of the cover plate toward the outer circumferential surface of the motor housing, and
    wherein the cooling air passes through the inclined opening hole, the moving flow of the cooling air is guided in the spiral shape toward the end portion of the outer circumferential surface along a longitudinal direction of the motor housing.

11. The high voltage cooling fan motor unit of claim 10, wherein the cooling fin is protruded to be inclined upwards toward the outside of the cover plate toward a longitudinal end portion thereof.

12. The high voltage cooling fan motor unit of claim 10, wherein the cooling fin comprises
    a main cooling fin located in the state of facing the groove part; and
    an auxiliary cooling fin spaced toward the outside of the radial direction of the cover plate with respect to the main cooling fin.

\* \* \* \* \*